(12) United States Patent
Kim

(10) Patent No.: US 6,941,496 B2
(45) Date of Patent: Sep. 6, 2005

(54) ERROR DETECTING CIRCUIT FOR DETECTING THE LOCATION OF ERROR

(75) Inventor: Young-wan Kim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 624 days.

(21) Appl. No.: 10/037,909

(22) Filed: Nov. 9, 2001

(65) Prior Publication Data

US 2002/0120892 A1 Aug. 29, 2002

(30) Foreign Application Priority Data

Feb. 28, 2001 (KR) ........................................ 2001-10355

(51) Int. Cl.[7] .............................................. G01R 31/28
(52) U.S. Cl. ........................................ 714/724; 714/48
(58) Field of Search ................................ 714/699, 724, 714/799, 48

(56) References Cited

U.S. PATENT DOCUMENTS

| | | | | |
|---|---|---|---|---|
| 5,444,859 A | * | 8/1995 | Baker et al. ................... 714/20 |
| 5,448,725 A | * | 9/1995 | Gervais ........................ 714/47 |
| 5,596,716 A | * | 1/1997 | Byers et al. .................. 714/48 |
| 5,729,553 A | * | 3/1998 | Motohara .................... 714/733 |
| 5,987,585 A | * | 11/1999 | Motoyama et al. ............ 712/1 |
| 6,016,564 A | * | 1/2000 | Hosokawa .................. 714/726 |

* cited by examiner

Primary Examiner—Albert Decady
Assistant Examiner—John P. Trimmings
(74) Attorney, Agent, or Firm—F.Chau & Associates, LLC

(57) ABSTRACT

An error detecting circuit for detecting the location of an error is provided. The error detecting circuit has an error data storing unit and an error data collecting unit. The error data storing unit divides a circuit having areas, and outputs a plurality of error signals in response to a plurality of state error signals, a serial chain signal, a lock-enable signal, and a chip error signal, which are enabled when an error occurs in the corresponding area. The serial chain signal reads the plurality of state error signals if the chip goes out of order when an error occurs in the circuit. The lock-enable signal determines whether or not to preserve the plurality of state error signals. In response to the serial chain signal, the error data storing unit enables a confirmation of at least one state error signals stored in the error data storing unit.

19 Claims, 2 Drawing Sheets

ERROR DETECTING CIRCUIT FOR DETECTING THE LOCATION OF ERROR

BACKGROUND OF THE INVENTION

1. Field of the Invention

The present invention relates to the design of semiconductor devices and the analysis of defects thereof and, more particularly, to an error detecting circuit for quickly detecting the location of an error in a semiconductor chip before the semiconductor chip is provided to a user.

2. Description of the Related Art

As the number of transistors integrated in a semiconductor chip increases, significantly more time and efforts are required for testing the semiconductor chip, which raises the manufacturing cost of the semiconductor chip. In testing a chip, both design error and manufacturing process error should be detected. In particular, it is technically very difficult and takes a significant amount of time to detect a chip that does not operate normally because of a tolerance corresponding to a manufacturing process, although the design of the chip has no problem at all.

Such chips having defects caused by design and manufacturing processes should be detected before shipping. For this, generally, design engineers prepare test vectors for detecting these defects when the chips are designed, and test engineers check for defects of the manufactured chips with the prepared test vectors. In principle, the test vectors should be prepared so that all possible defects that may occur in the design and manufacturing processes can be detected. In reality, manufacturers try to reduce costs by performing tests using only a minimum number of test vectors. After taking tests based on the minimum number of test vectors, these chips are provided to users. When these chips are used by users, defects which were not detected during the tests may occur. In this case, manufacturers should add test vectors for detecting these defects to the existing test vectors so that they can be detected during the tests.

To find the causes of these defects, design engineers reproduce these defects through computer simulation in which conditions that are presumed to be the cause of these defects in the circuit design are input. Through computer simulation, the design engineers check the causes and locations of these defects. If a design error causes the defects, then the chip design should be revised. If a tolerance of the manufacturing process causes the defects, then the design should be revised or the testing performed with additional test vectors, upon estimating which course of action is the most cost effective.

To accurately find the causes and locations of defects through computer simulation, significant simulation time and design engineers' efforts for analysis are needed. Also, computer simulation does not guarantee that the causes and locations of defects will be found with 100% accuracy. Therefore, it is very important to determine through the operating characteristics of a semiconductor chip, that is, the operating characteristics of hardware, where and why defects occur in a circuit. Unless design engineers consider these points, losses in time and costs can be incurred.

In particular, chips manufactured based on a circuit design drawn by a design tool that automatically generates a circuit design have a more serious problem. After taking tests using the minimum basic test vectors, these chips are determined to be normal chips and shipped to users. However, when users are using these chips, defects may occur and it is very difficult to find the causes and locations of defects in these chips.

SUMMARY OF THE INVENTION

To solve the above and other related problems of the prior art, there is provided an error detecting circuit for quickly detecting the cause and location of an error in a semiconductor chip.

According to an aspect of the present invention, there is provided an error detecting circuit. An error data storing unit divides a circuit in a chip into predetermined areas, and outputs a plurality of error signals in response to a plurality of state error signals, a serial chain signal, a lock-enable signal, and a chip error signal. Each of the plurality of state error signals is enabled when an error occurs in a corresponding predetermined area. The serial chain signal is for reading the plurality of state error signals stored in the chip if the chip goes out of order when an error occurs in the circuit in the chip. The lock-enable signal is for determining whether or not to preserve the plurality of state error signals. An error data collecting unit outputs the chip error signal in response to the plurality of error signals output from the error data storing unit. The error data storing unit stores and outputs at least one of the plurality of state error signals and, in response to the serial chain signal, enables confirmation of at least one of the plurality of state error signals stored in the error data storing unit.

According to another aspect of the present invention, the error data storing unit comprises a plurality of error data registers. Each of the plurality of error data registers comprises a first error data register, second through (N–1)-th error data registers, and an N-th error data register. The first error data register outputs a first error signal in response to a first state error signal, the serial chain signal, the lock-enable signal and the chip error signal. The second through (N–1)-th error data registers respectively output second through (N–1)-th error signals in response to second through (N–1)-th state error signals, the serial chain signal, the lock-enable signal, the chip error signal, and the first error signal. An N-th error data register outputs an N-th error signal in response to an N-th state error signal, the serial chain signal, the lock-enable signal, the chip error signal, and the (N–1)-th error signal. The first state error signal, the second through (N–1)-th state error signals, and the N-th state error signal are comprised in the plurality of state error signals.

According to yet another aspect of the present invention, the first error data register comprises a NAND gate, a multiplexer, and a D flip-flop. The NAND gate outputs a control signal in response to the lock-enable signal and the chip error signal. The multiplexer selects one of the first error signal or the first state error signal in response to the serial chain signal and the control signal. The D flip-flop has an input terminal for receiving an output signal of the multiplexer and an output terminal for outputting the first error signal.

According to still yet another aspect of the present invention, any one of the second through (N–1)-th error data registers comprises a NAND gate, a multiplexer, and a D flip-flop. The NAND gate outputs a control signal in response to the lock-enable signal and the chip error signal. A multiplexer selects one of the first error signal, the second error signal and the second state error signal, in response to the serial chain signal and the control signal. The D flip-flop has an input terminal for receiving an output signal of the multiplexer and an output terminal for outputting the second error signal.

According to a further aspect of the present invention, the N-th error data register comprises a NAND gate, a multiplexer, and a D flip-flop. The NAND gate outputs an N-th control signal in response to the lock-enable signal and the chip error signal. The multiplexer selects one of the (N−1)-th error signal, the N-th error signal and the N-th state error signal in response to the serial chain signal and the N-th control signal. The D flip-flop has an input terminal for receiving an output signal of the multiplexer and an output terminal for outputting the N-th error signal.

These and other aspects, features and advantages of the present invention will become apparent from the following detailed description of preferred embodiments, which is to be read in connection with the accompanying drawings.

DESCRIPTION OF THE PREFERRED EMBODIMENTS

Figure 1:
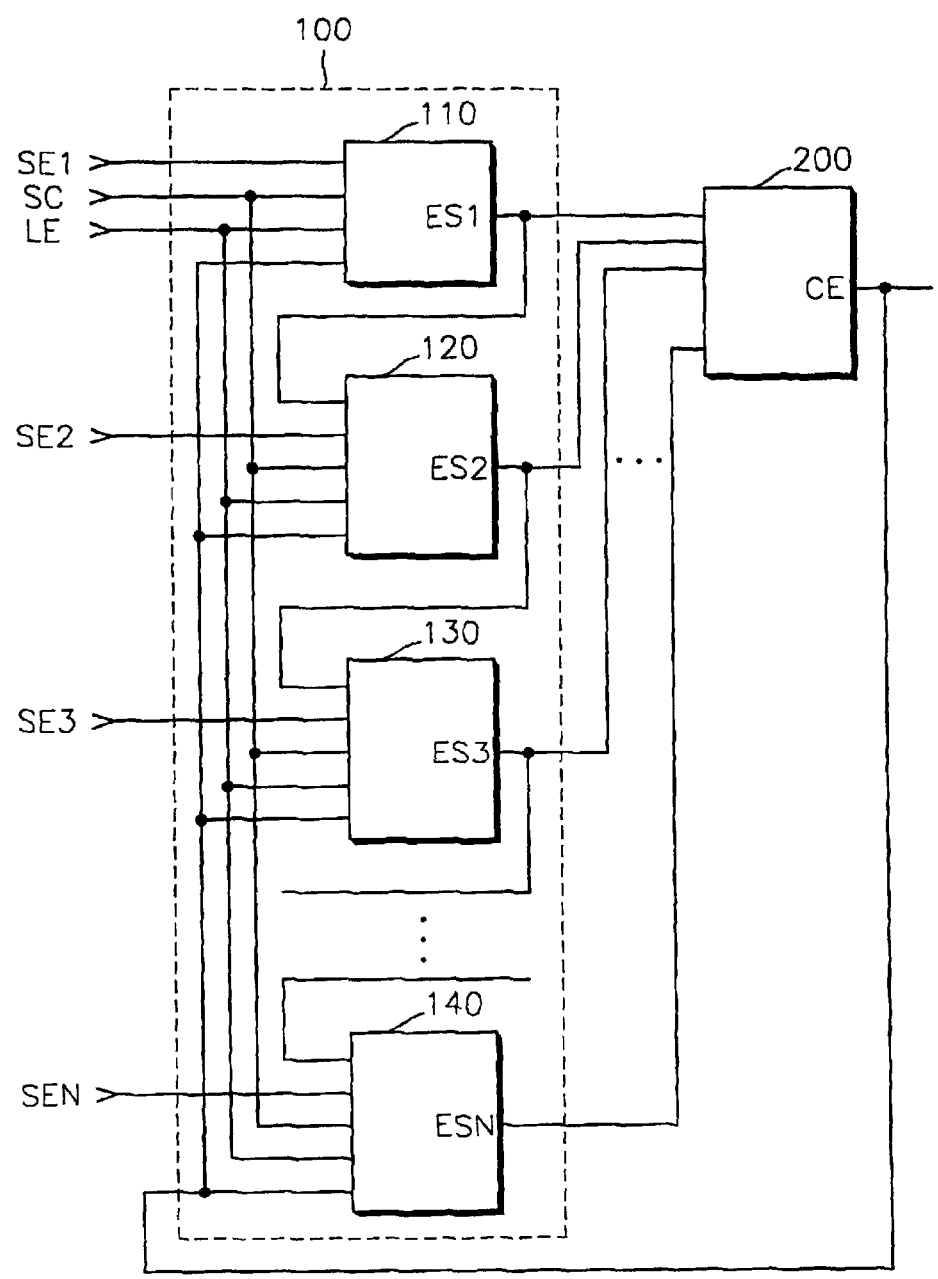
FIG. 1 is a block diagram of an error detecting circuit according to the present invention, according to an illustrative embodiment of the present invention.

FIG. 1 is a block diagram of an error detecting circuit, according to an illustrative embodiment of the present invention. The error detecting circuit has an error data storing unit 100 and an error data collecting unit 200.

The error data storing unit 100 divides a circuit that is implemented in a chip into predetermined areas (not shown). Moreover, the error data storing unit 100 outputs a plurality of error signals (ES1 through ESN) in response to a plurality of state error signals (SE1 through SEN), a serial chain signal (SC), a lock-enable signal (LE), and a chip error signal (CE). Each of the plurality of state error signals (SE1 through SEN) is enabled when an error occurs in a corresponding predetermined area.

The serial chain signal (SC) is for reading the plurality of state error signals stored in the chip if the chip goes out of order when an error occurs in the circuit implemented in the chip. The lock-enable signal (LE) is for determining whether or not to preserve the plurality of generated state error signals (SE1 through SEN). The chip error signal (CE) is an output signal of the error data collecting unit 200. The error data collecting unit 200 outputs the chip error signal (CE) in response to the plurality of error signals (ES1 through ESN) of the error data storing unit 100.

The error data storing unit 100 stores and outputs at least one of the plurality of state error signals (SE1 through SEN), each of which is enabled when an error occurs in a corresponding divided predetermined area. In response to the serial chain signal (SC), the error data-storing unit 100 enables confirmation of the state of at least one of the state error signals stored in the error data-storing unit 100. The serial chain signal (SC) is compulsorily provided from the outside of the chip if the chip goes out of order due to an error in the divided predetermined areas.

The error data-storing unit 100 has a plurality of error data registers 110 through 140.

Figure 2:
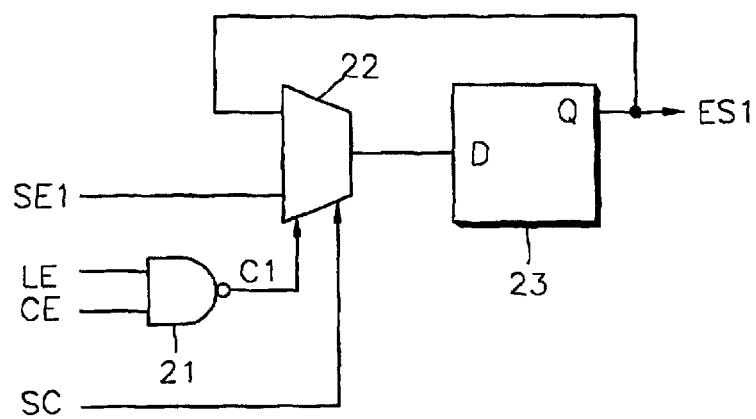
FIG. 2 is an internal circuit diagram of a first error data register 110 of the error data storing unit 100 of the error detecting circuit shown in FIG. 1, according to an illustrative embodiment of the present invention.

FIG. 2 is an internal circuit diagram of a first error data register 110 of the error data-storing unit 100 of the error detecting circuit shown in FIG. 1, according to an illustrative embodiment of the present invention.

The first error data register 110 outputs a first error signal (ES1) in response to a first state error signal (SE1) among the plurality of state error signals (SE1 through SEN), the serial chain signal (SC), the lock-enable signal (LE), and the chip error signal (CE). The first error data register 110 has a NAND gate 21, a multiplexer 22 and a D flip-flop 23. The NAND gate 21 outputs a control signal (C1) in response to the lock-enable signal (LE) and the chip error signal (CE). The multiplexer 22 selects one of the first error signal (ES1) (which is the output signal of the D flip-flop 23) or the first state error signal (SE1), in response to the serial chain signal (SC) and the control signal (C1). The D flip-flop 23 receives the output signal of the multiplexer 22 through the input terminal (D) and outputs the first error signal (ES1) through the positive output terminal (Q).

Figure 3:
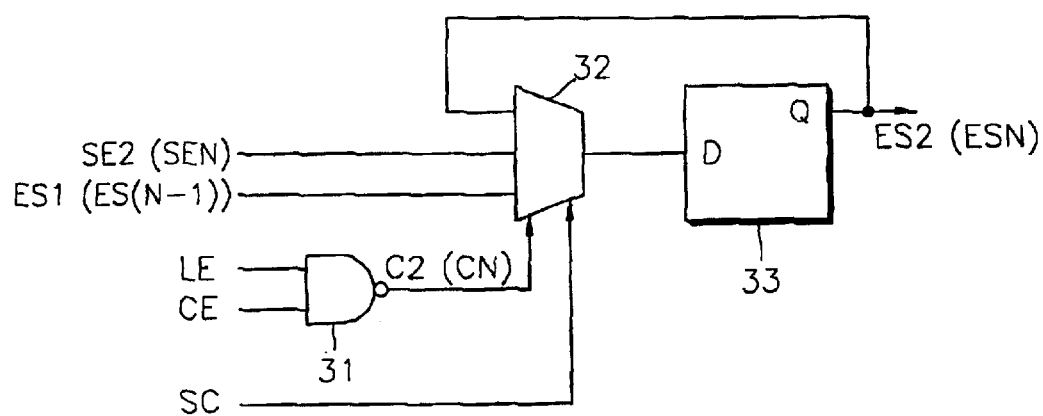
FIG. 3 is an internal circuit diagram of any one of a second error data register 120 through an N-th error data register 140 (N is a positive integer), according to an illustrative embodiment of the present invention.

FIG. 3 is an internal circuit diagram of any one of a second error data register 120 through an N-th error data register (N is a positive integer) of the error data storing unit 100 of the error detecting circuit shown in FIG. 1, according to an illustrative embodiment of the present invention. For the purpose of illustration, second error data register 120 (N=2) is specifically shown and described with respect to FIG. 3.

The second error data storing register 120 outputs a second error signal (ES2) in response to a second state error signal (SE2), the serial chain signal (SC), the lock-enable signal (LE), the chip error signal (CE), and the first error signal (ES1). The second error data storing register 120 has a NAND gate 31, a multiplexer 32, and a D flip-flop 33. The NAND gate 31 outputs a control signal (C2) in response to the lock-enable signal (LE) and the chip error signal (CE). The multiplexer 32 selects one of the first error signal (ES1), the second error signal (ES2) (which is the output signal of the D flip-flop 33), or the second state error signal (SE2), in response to the serial chain signal (SC) and the control signal (C2). The D flip-flop 33 receives the output signal of the multiplexer 32 through the input terminal (D) and outputs the second error signal (ES2) through the positive output terminal (Q).

The third error data register 130 (N=3) will now be described with respect to FIGS. 1 and 3. The third error data register 130 has the same structure as the second error data register 120. However, a third state error signal (SE3) is input as an input signal instead of the second error signal (SE2), and a control signal (C3) and a third error signal (ES3) are generated instead of the control signal (C2) and the second error signal (ES2), respectively.

The N-th error data register 140 will now be described with respect to FIGS. 1 and 3. The N-th error data register 140 outputs an N-th error signal (ESN) in response to an N-th state error signal (SEN), the serial chain signal (SC), the lock-enable signal (LE), the chip error signal (CE), and an (N−1)-th error signal (ES(N−1)). The N-th error data register 140 has a NAND gate 31, a multiplexer 32, and a D flip-flop 33. The NAND gate 31 outputs a control signal (CN) in response to the lock-enable signal (LE) and the chip error signal (CE). The multiplexer 32 selects one of the (N−1)-th error signal (ES(N−1)), the N-th error signal (ESN) (which is the output signal of the D flip-flop 33), or the N-th state error signal (SEN), in response to the serial chain signal (SC) and the control signal (CN). The D flip-flop 33 receives the output signal of the multiplexer 32 through the input terminal (D) and outputs the N-th error signal (ESN) through the positive output terminal (Q).

The above error detecting circuit according to the present invention has a prerequisite step of an initial setting step. The initial setting step is for detecting a processing error during a transition to a state or a condition statement which is not used in the state machine and condition statement of software for automatically designing a circuit. As an example of designing a circuit that satisfies the prerequisite, for a case in which an error is considered to exist if first through third conditions are not satisfied, a state machine written in a Verilog hardware description language (HDL) is as follows:

```
case (state)
    case1: next state description 1
    case2: next state description 2
    case3: next state description 3
    default: error case description
end case
```

As another example of designing a circuit that satisfies the prerequisite, for a case in which an error is considered to exist if first through third conditions are not satisfied, a state machine written in a Very high speed integrated circuit Hardware Description Language (VHDL) is as follows:

```
case (state) is
    when case1=>next state
        description 1
    when case2=>next state
        description 2
    when case3=>next state
        description 3
    when others=>error case
        description
end case
```

As in the Verilog HDL command (default) or in the VHDL command statement (when others), codes are written so that a bit for reporting an error situation is set. Then, if an actual circuit is generated using the state machine prepared as described above, the prerequisite condition is completed. To quickly detect an area in which an error actually occurs, a circuit is divided into predetermined areas in the initial stage of design and the prerequisite should be prepared so that errors occurring in the respective divided predetermined areas can be reported. Also, to report the occurrence of an error, a conditional statement (if else) may be used in the design instead of the command (default) shown above, so that error bits are set. Each of these error bits may be stored in a corresponding register 110 through 140 and processed by the internal system of the chip. Also, the stored error bits may be extracted to the outside of the chip by a user, using a command from the outside of the chip, and then analyzed so that the locations of errors can be easily detected.

However, due to the characteristics of a circuit in which inputs and outputs are correlated to each other, an error occurring in one part of a circuit propagates to the remaining parts of the circuit. A predetermined time after an initial error occurs, errors occur in a plurality of areas and, thus, it is impossible to detect where the initial error occurred. Therefore, a chip error signal (CE), which is generated immediately after an error occurs, is used in the present invention to detect the location of an error occurrence. In the present invention, an error data register, corresponding to an area where an error occurred first, holds a logic value indicating that an error occurred, while other error data registers corresponding to the remaining areas do not store error signals, although error signals are generated in the corresponding areas. By doing so, only information on the location of an error that occurred first is held in the corresponding error data register and, therefore, the location of the first error can be quickly detected.

Also, when a system goes out of order due to an error in a predetermined divided area, the program for the system does not operate normally and information stored in the error data register may not be read through a normal method. In this case, the state of the chip is adjusted to enter into a preset test mode and a predetermined signal is compulsorily provided from the outside of the chip so that error data stored in the error data register can be read. By doing so, the location and cause of an error can be more quickly detected.

Basically the present invention is designed to quickly find and handle the cause and location of a defect when, due to basic test vectors which cannot detect the defect, a chip is determined to be normal and the defect is found later when a user uses the chip. However, the present invention can also be used to find a logic error in a state machine. For example, if a control signal coming from another clock domain is used in a state machine without synchronizing the control signal to a signal used in the present clock domain, a signal defined in the state machine may branch into an unexpected location due to the difference between the defined signal and the control signal. In this case, the error bit of the error data register is also set.

So far, optimum embodiments are explained in the drawings and specification, and though specific terminologies are used here, they were only used to explain the present invention. Therefore, the present invention is not restricted to the above-described embodiments and many variations are possible within the spirit and scope of the present invention. The scope of the present invention is not determined by the description but by the accompanying claims.

As described above, when chip defects that were not detected through the basic test vectors are found when a user uses the chip, the error detecting circuit according to the present invention can quickly and easily detect the cause and location of defects in a chip.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. An error detecting circuit comprising:
   an error data storing unit for dividing a circuit implemented in a chip into predetermined areas, and outputting a plurality of error signals in response to a plurality of state error signals,
   a serial chain signal,
   a lock-enable signal, and
   a chip error signal,
   each of the plurality of state error signals being enabled when an error occurs in a corresponding predetermined area,
   the serial chain signal for reading the plurality of state error signals stored in the chip if the chip goes out of order when the error occurs in the circuit, and
   the lock-enable signal for determining whether or not to preserve the plurality of state error signals; and
   an error data collecting unit for outputting the chip error signal in response to the plurality of error signals output from the error data storing unit,
   wherein the error data storing unit stores and outputs at least one of the plurality of state error signals and, in response to the serial chain signal, enables confirmation of at least one of the plurality of state error signals stored in the error data storing unit by observing the chip error signal.

2. The error detecting circuit of claim 1, wherein the error data storing unit comprises a plurality of error data registers, each of the plurality of error data registers comprising:

a first error data register for outputting a first error signal in response to a first state error signal, the serial chain signal, the lock-enable signal and the chip error signal;

second through (N–1)-th error data registers for respectively outputting second through (N–1)-th error signals in response to second through (N–1)-th state error signals, the serial chain signal, the lock-enable signal, the chip error signal, and the first error signal; and an N-th error data register for outputting an N-th error signal in response to an N-th state error signal, the serial chain signal, the lock-enable signal, the chip error signal, and the (N–1)-th error signal, wherein the first state error signal, the second through (N–1)-th state error signals, and the N-th state error signal are comprised in the plurality of state error signals.

3. The error detecting circuit of claim 2, wherein the first error data register comprises:

a NAND gate for outputting a control signal in response to the lock-enable signal and the chip error signal;

a multiplexer for selecting one of the first error signal or the first state error signal in response to the serial chain signal and the control signal; and a D flip-flop having an input terminal for receiving an output signal of the multiplexer and an output terminal for outputting the first error signal.

4. The error detecting circuit of claim 3, wherein the output terminal of the D flip-flop is a positive output terminal.

5. The error detecting circuit of claim 2, wherein any one of the second through (N–1)-th error data registers comprises:

a NAND gate for outputting a control signal in response to the lock-enable signal and the chip error signal;

a multiplexer for selecting one of the first error signal, the second error signal and the second state error signal, in response to the serial chain signal and the control signal; and a D flip-flop having an input terminal for receiving an output signal of the multiplexer and an output terminal for outputting the second error signal.

6. The error detecting circuit of claim 5, wherein the output terminal of the D flip-flop is a positive output terminal.

7. The error detecting circuit of claim 5, wherein the output terminal of the D flip-flop is a positive output terminal.

8. The error detecting circuit of claim 2, wherein the N-th error data register comprises:

a NAND gate for outputting an N-th control signal in response to the lock-enable signal and the chip error signal;

a multiplexer for selecting one of the (N–1)-th error signal, the N-th error signal and the N-th state error signal in response to the serial chain signal and the N-th control signal; and a D flip-flop having an input terminal for receiving an output signal of the multiplexer and an output terminal for outputting the N-th error signal.

9. A device for detecting an error in a circuit implemented in a chip, the device comprising:

an error data storing unit for dividing the circuit into a plurality of predetermined areas and outputting a plurality of error signals in response to a plurality of state error signals, a serial chain signal, a lock-enable signal, and a chip error signal, each of the plurality of state error signals being enabled when an error occurs in a corresponding one of the plurality of predetermined areas, the serial chain signal for reading the plurality of state error signals stored in the chip if the chip goes out of order, and the lock-enable signal for determining whether or not to preserve the plurality of state error signals; and an error data collecting unit for outputting the chip error signal in response to the plurality of error signals, wherein the error data storing unit stores and outputs at least one of the plurality of state error signals through the chip error signal to specifically indicate which of the predetermined areas contain the error.

10. The device of claim 9, wherein the error data storing unit outputs the at least one of the plurality of state error signals during a normal operation to retrieve error information.

11. The device of claim 9, wherein the error data storing unit outputs the at least one of the plurality of state error signals during an abnormal operation in which the chip goes out of order, in response to the serial chain signal.

12. The device of claim 11, wherein the serial chain signal is provided externally with respect to the chip.

13. The device of claim 9, wherein the error data storing unit comprises a plurality of error data registers, each of the plurality of error data registers comprising:

a first error data register for outputting a first error signal in response to a first state error signal, the serial chain signal, the lock-enable signal and the chip error signal;

second through (N–1)-th error data registers for respectively outputting second through (N–1)-th error signals in response to second through (N–1)-th state error signals, the serial chain signal, the lock-enable signal, the chip error signal, and the first error signal; and an N-th error data register for outputting an N-th error signal in response to an N-th state error signal, the serial chain signal, the lock-enable signal, the chip error signal, and the (N–1)-th error signal, wherein the first state error signal, the second through (N–1)-th state error signals, and the N-th state error signal are comprised in the plurality of state error signals.

14. The device of claim 13, wherein the first error data register comprises:

a NAND gate for outputting a control signal in response to the lock-enable signal and the chip error signal;

a multiplexer for selecting one of the first error signal or the first state error signal in response to the serial chain signal and the control signal; and a D flip-flop having an input terminal for receiving an output signal of the multiplexer and an output terminal for outputting the first error signal.

15. The device of claim 14, wherein the output terminal of the D flip-flop is a positive output terminal.

16. The device of claim 13, wherein any one of the second through (N–1)-th error data registers comprises:

a NAND gate for outputting a control signal in response to the lock-enable signal and the chip error signal;

a multiplexer for selecting one of the first error signal, the second error signal and the second state error signal, in response to the serial chain signal and the control signal; and a D flip-flop having an input terminal for receiving an output signal of the multiplexer and an output terminal for outputting the second error signal.

17. The device of claim 16, wherein the output terminal of the D flip-flop is a positive output terminal.

18. The device of claim 13, wherein the N-th error data register comprises:

a NAND gate for outputting an N-th control signal in response to the lock-enable signal and the chip error signal;

a multiplexer for selecting one of the (N−1)-th error signal, the N-th error signal and the N-th state error signal in response to the serial chain signal and the N-th control signal; and a D flip-flop having an input terminal for receiving an output signal of the multiplexer and an output terminal for outputting the N-th error signal.

19. The device of claim 18, wherein the output terminal of the D flip-flop is a positive output terminal.

* * * * *